(12) United States Patent
Noda et al.

(10) Patent No.: US 8,670,082 B2
(45) Date of Patent: Mar. 11, 2014

(54) THIN FILM TRANSISTOR, DISPLAY DEVICE AND LIQUID CRYSTAL DISPLAY DEVICE

(75) Inventors: Takeshi Noda, Mobara (JP); Takuo Kaitoh, Mobara (JP); Hidekazu Miyake, Mobara (JP); Takeshi Sakai, Kokubunji (JP)

(73) Assignees: Japan Display Inc., Tokyo (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 102 days.

(21) Appl. No.: 13/242,283

(22) Filed: Sep. 23, 2011

(65) Prior Publication Data

US 2012/0080683 A1    Apr. 5, 2012

(30) Foreign Application Priority Data

Sep. 30, 2010   (JP) .................................. 2010-222258

(51) Int. Cl.
*G02F 1/136* (2006.01)
*H01L 29/04* (2006.01)

(52) U.S. Cl.
USPC ................................. 349/44; 349/110; 257/72

(58) Field of Classification Search
USPC ................ 349/44, 110; 257/59, 66, E27.121, 257/E29.294, E29.291, 57, 72, E31.122, 257/E29.282, 340, 435, 409, E21.414; 438/158, 159
See application file for complete search history.

(56) References Cited

U.S. PATENT DOCUMENTS 8,034,674 B2 * 10/2011 Nagai et al. .................... 438/157
2008/0246036 A1 * 10/2008 Yamazaki et al. ............... 257/72
2009/0101913 A1 * 4/2009 Shih et al. ........................ 257/72

FOREIGN PATENT DOCUMENTS

JP    2010039413 A  *  2/2010

* cited by examiner

*Primary Examiner* — Bumsuk Won
*Assistant Examiner* — Jia Pan
(74) *Attorney, Agent, or Firm* — Antonelli, Terry, Stout & Kraus, LLP.

(57) ABSTRACT

A thin film transistor, a display device and a liquid crystal display device are provided. The thin film transistor includes a gate electrode film onto which light from a light source is irradiated, a semiconductor film formed on the gate electrode film and on an opposite side to the light source side through an insulating film, first and second electrode films formed to be in electrical contact with the semiconductor film, and a first shielding film formed in a same layer as the gate electrode film and electrically isolated from the gate electrode film, wherein the first shielding film overlaps a part of the semiconductor film as seen from the light irradiation direction and also overlaps at least a part of the first electrode film as seen from the light irradiation direction.

16 Claims, 7 Drawing Sheets

THIN FILM TRANSISTOR, DISPLAY DEVICE AND LIQUID CRYSTAL DISPLAY DEVICE

CROSS-REFERENCE TO RELATED APPLICATION

The present application claims priority from Japanese patent application JP 2010-222258 filed on Sep. 30, 2010, the content of which is hereby incorporated by reference into this application.

BACKGROUND OF THE INVENTION

1. Field of the Invention

The present invention relates to a thin film transistor and a display device or a liquid crystal display device having the same. More particularly, the present invention relates to the improvement of the characteristics of a thin film transistor and the improvement of the display quality of a display device through suppression of leakage current.

2. Description of the Related Art

In a display device such as a liquid crystal display device, display control of respective pixels is performed using thin film transistors. Generally, in a thin film transistor, a gate electrode is arranged to be opposed to a semiconductor film, and an area of the semiconductor film that is opposed to the gate electrode becomes a channel area. At both ends of the channel area, a source electrode and a drain electrode are arranged, respectively. A thin film transistor having a reversely staggered structure (etched channel structure), in which the gate electrode is more closely positioned on a light source side than the semiconductor film, is preferable in terms of production cost. This is because when light from a light source such as a backlight or the like is irradiated onto the thin film transistor having the above-described structure, the gate electrode itself functions as a shielding mask against the opposed semiconductor film.

If the semiconductor film is irradiated with light, hole-electron pairs may occur. Further, due to the hole-electron pairs, leakage current may flow. Accordingly, in terms of occurrence of the hole-electron pairs, it is preferable that the gate electrode film that functions as a shielding mask has a large area and is opposed to the semiconductor film.

In the case where a voltage is applied between a gate electrode and a source electrode (drain electrode), a strong electric field occurs near the boundary of the source electrode (drain electrode) and the semiconductor film. Due to this strong electric field, the leakage current is increased. Accordingly, in terms of occurrence of the strong electric field, if the gate electrode is opposed to the source electrode (drain electrode) in the stacking direction, it is preferable that the opposed area be small, and it is more preferable that the gate electrode be not opposed to the source electrode (drain electrode).

FIG. 9A is a conceptual view illustrating the structure of a thin film transistor in the related art. A semiconductor film SCF is arranged above a gate electrode film GF, and a source electrode film SF and a drain electrode film DF are respectively arranged above both ends of the semiconductor film SCF through an impurity semiconductor film IDS. Here, parts of the gate electrode film GF, the source electrode film SF, and the drain electrode film DF function as a gate electrode, a source electrode, and a drain electrode, respectively. Further, light from a light source is irradiated from the lower side to the upper side in the drawing. The light from the light source is indicated by arrows in the drawing.

In the thin film transistor illustrated in FIG. 9A, as seen from the stacking direction (upward/downward direction in the drawing), the gate electrode film GF does not have an area that overlaps the source electrode film SF and the drain electrode film DF. That is, the gate electrode film GF is offset from the source electrode film SF and the drain electrode film DF. As a result, even in the case where a voltage is applied between the gate electrode film GF and the source electrode film SF (drain electrode film DF), a strong electric field does not occur near the boundary of the source electrode film SF (drain electrode film DF) and the semiconductor film SCF in comparison to a case where the gate electrode film GF overlaps the source electrode film SF (drain electrode film DF).

However, as seen from the irradiation direction (upward/downward direction in the drawing) of the light from the light source, the gate electrode film GF overlaps only a part of the semiconductor film SCF. That is, the gate electrode film GF is opposed to only a part of the semiconductor film SCF. Accordingly, the gate electrode film GF does not sufficiently function as a shielding mask with respect to the semiconductor film SCF. That is, the thin film transistor illustrated in FIG. 9A has a structure in which hole-electron pairs are liable to occur in the semiconductor film SCF due to the light irradiated from the light source. As a result, leakage current occurs. In the drawing, the occurring hole-electron pairs are schematically illustrated, and if a voltage is applied between the gate electrode film GF and the source electrode film SF, holes or electrons of the occurring hole-electron pairs reach the source electrode film SF to cause the leakage current to occur.

FIG. 9B is a schematic view illustrating the structure of a thin film transistor in the related art. In the same manner as the thin film transistor illustrated in FIG. 9A, the gate electrode film GF overlaps the semiconductor film SCF as seen from the light irradiation direction. That is, the gate electrode film GF is opposed to the semiconductor film SCF. However, in comparison to the thin film transistor illustrated in FIG. 9A, the gate electrode film GF is widened to the left and right sides in the drawing, and thus an area where the gate electrode film GF and the semiconductor film SCF overlap each other becomes larger. Because of this, the gate electrode film GF functions more as a shielding mask with respect to the semiconductor film SCF. That is, in the thin film transistor illustrated in FIG. 9B, the gate electrode film GF prevents the light from the light source from being irradiated onto the semiconductor film SCF as the shielding mask, and thus it is difficult for the hole-electron pairs to occur in the structure of the thin film transistor.

However, as seen from the stacking direction, the gate electrode film GF also overlaps the source electrode film SF and the drain electrode film DF. That is, the gate electrode film GF is opposed to the source electrode film SF and the drain electrode film DF. As a result, if a voltage is applied between the gate electrode film GF and the source electrode film SF (drain electrode film DF), a strong electric field occurs near the boundary of the source electrode film SF (drain electrode film DF) and the semiconductor film SCF. Due to this strong electric field, the leakage current is increased. In the drawing, areas where the strong electric field is liable to occur are indicated by surrounding dashed lines.

FIG. 9C is a conceptual view illustrating the structure of a thin film transistor in the related art. In the same manner as the thin film transistors illustrated in FIGS. 9A and 9B, the gate electrode film GF is opposed to the semiconductor film SCF, and the widened state of the gate electrode film GF is between the thin film transistor illustrated in FIG. 9A and the thin film transistor illustrated in FIG. 9B. That is, in comparison to the gate electrode film GF illustrated in FIG. 9A, the gate electrode film GF functions more as the shielding mask, but in comparison to the gate electrode film GF illustrated in FIG. 9B, it functions less as the shielding mask. Further, as seen from the stacking direction, the gate electrode film GF is opposed to parts of the source electrode film SF and the drain electrode film DF, respectively.

In the thin film transistor illustrated in FIG. 9C, the hole-electron pairs occur due to the light irradiated from the light source, and this causes the leakage current to occur. Further, since the gate electrode film GF is also opposed to a part of the source electrode film SF (drain electrode film DF), the leakage current due to the occurring hole-electron pairs becomes much greater by the strong electric field that occurs near the boundary of the corresponding part of the source electrode film SF (drain electrode film DF) and the semiconductor film SCF. In the drawing, areas where the strong electric field is liable to occur are indicated by surrounding dashed lines, and the occurring hole-electron pairs are schematically illustrated.

In the thin film transistors in the related art, even if the widening state of the gate electrode film GF is adjusted, it is difficult to suppress both the occurrence of the hole-electron pairs and the occurrence of the strong electric field.

SUMMARY OF THE INVENTION

In consideration of the above-described problems, it is desirable to provide a thin film transistor that can suppress leakage current through suppression of both hole-electron pairs and strong electric field occurring near a source electrode (drain electrode), a display device or a liquid crystal display device having the same.

(1) In order to solve the above-described problems, a thin film transistor according to an aspect of the present invention includes a gate electrode film onto which light from a light source is irradiated; a semiconductor film formed on an opposed to side of the gate electrode film to the light source side, through an insulating film; first and second electrode films formed to be in electrical contact with the semiconductor film; and a first shielding film formed in a same layer as the gate electrode film and electrically isolated from the gate electrode film, wherein the first shielding film overlaps a part of the semiconductor film as seen from the light irradiation direction and also overlaps at least a part of the first electrode film as seen from the light irradiation direction.

(2) In the thin film transistor as described in (1), the first electrode film may be arranged to be spaced apart from the gate electrode film as seen from the light irradiation direction.

(3) In the thin film transistor as described in (1), at least a part of the first electrode film may include a contact surface area that is in electrical contact with the semiconductor film.

(4) In the thin film transistor as described in any one of (1) to (3), the first electrode film and the first shielding film may be in electrical contact with each other.

(5) The thin film transistor as described in any one of (1) to (4) may further include a second shielding film formed in the same layer as the gate electrode film and electrically isolated from the gate electrode film, wherein the second shielding film may overlap a part of the semiconductor film as seen from the light irradiation direction and also may overlap at least a part of the second electrode film as seen from the light irradiation direction.

(6) A display device according to another aspect of the present invention may be a display device or a liquid crystal display device which has the thin film transistor described in any one of (1) to (5).

According to the aspects of the invention, the thin film transistor that can suppress the leakage current through suppression of both the hole-electron pairs and the strong electric field occurring near the source electrode (drain electrode), and the display device having the same can be provided.

DETAILED DESCRIPTION OF THE INVENTION

Hereinafter, a thin film transistor and a display device having the same according to an embodiment of the invention will be described with reference to the drawings.

First Embodiment

Figure 1:
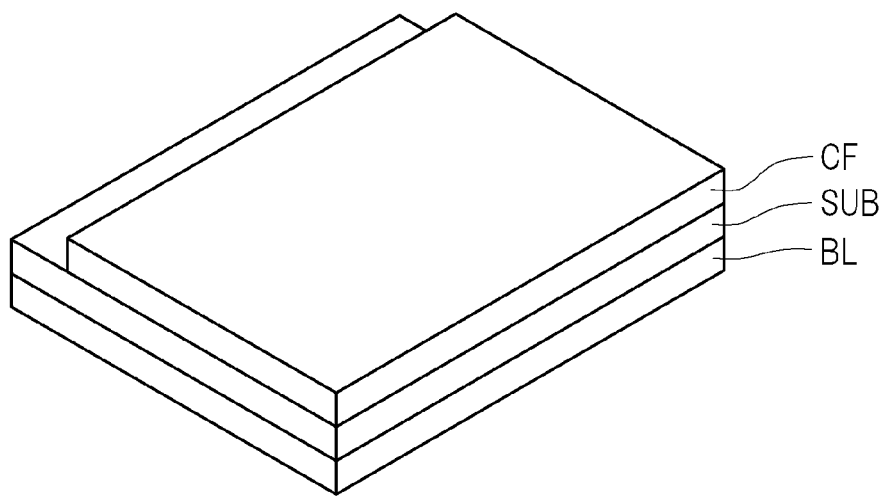
FIG. 1 is a perspective view of a liquid crystal display device as a whole according to an embodiment of the invention.

A display device according to a first embodiment of the invention is a liquid crystal display device according to one type of IPS (In-Plane Switching). FIG. 1 is a perspective view of a liquid crystal display device as a whole according to this embodiment of the invention. As illustrated in FIG. 1, the liquid crystal display device includes a TFT substrate SUB on which gate signal lines, drain signal lines, thin film transistors, pixel electrodes, common electrodes, and the like are arranged, a filter substrate CF opposed to the TFT substrate SUB and having color filters installed thereon, a liquid crystal material sealed in an area that is inserted between both the substrates, and a backlight BL positioned on an opposite side to the filter substrate CF side of the TFT substrate SUB. The TFT substrate SUB, the filter substrate CF, and the liquid crystal material constitute a liquid crystal panel. The thin film transistors and the like are arranged on the TFT substrate SUB that is a transparent substrate such as a glass substrate.

Figure 2:
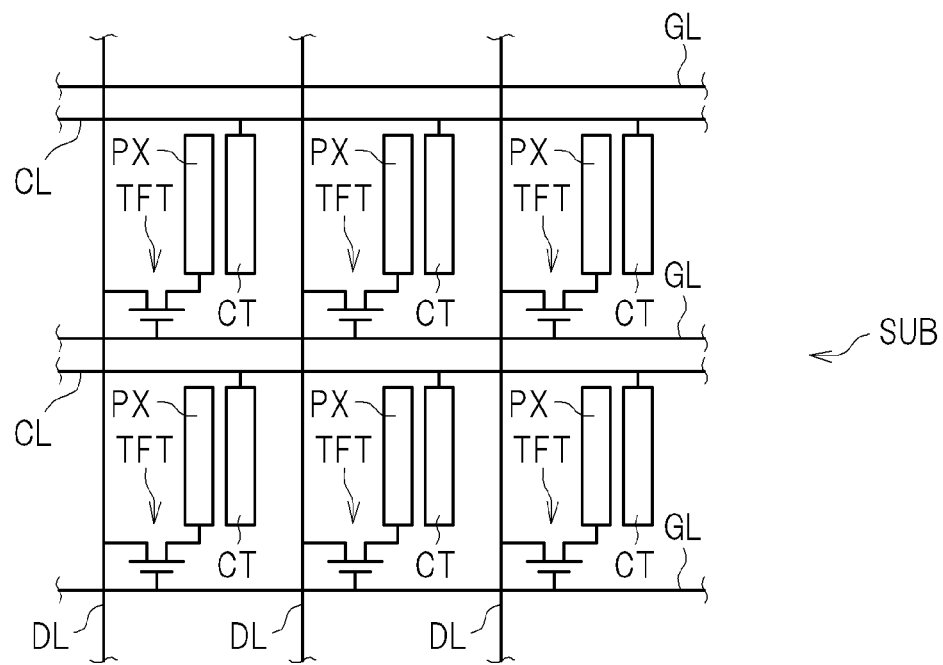
FIG. 2 is a diagram illustrating an equivalent circuit of a main part of a TFT substrate of a liquid crystal display device according to an embodiment of the invention.

FIG. 2 is a diagram illustrating an equivalent circuit of a main part of the TFT substrate SUB of the liquid crystal display device as described above.

In FIG. 2, on the TFT substrate SUB, plural gate signal lines GL are extended at equal intervals in the horizontal direction in the drawing, and plural drain signal lines DL are extended at equal intervals in the vertical direction in the drawing. Further, grid-like pixel areas are compartmented by the gate signal lines GL and the drain signal lines DL. Further, common signal lines CL are extended in parallel to the respective gate signal lines GL in the horizontal direction in the drawing.

At corners of the respective pixel areas that are compartmented by the gate signal lines GL and the drain signal lines DL, thin film transistors TFT are formed, and gate electrodes of the thin film transistors TFT are connected to the gate signal lines GL and drain electrodes thereof are connected to the drain signal lines DL. Further, in each pixel area, a pair of a pixel electrode PX and a common electrode CT is formed, and the pixel electrode PX is connected to a source electrode of the thin film transistor TFT and the common electrode CT is connected to the common signal line CL.

In the above-described circuit configuration, a reference voltage is applied to the common electrode CT of each pixel area through the common signal line CL, and a gate voltage is selectively applied to the gate signal line GL, so that current that flows through the thin film transistor TFT is controlled. Further, by the selectively applied gate voltage, the voltage of the drain signal that is supplied to the drain signal line DL is selectively applied to the pixel electrode PX. Accordingly, the orientation of liquid crystal molecules is controlled and an image is displayed.

At this time, in FIG. 2, although it is described that the gate electrode of the thin film transistor TFT is connected to the gate signal line GL, the gate electrode and the gate signal line GL are actually on the same film, which is a gate electrode film GF. In the same manner, the drain electrode and the drain signal line DL are formed on the same film, which is a drain electrode film DF. The film for forming the source electrode is a source electrode film SF.

Figure 3:
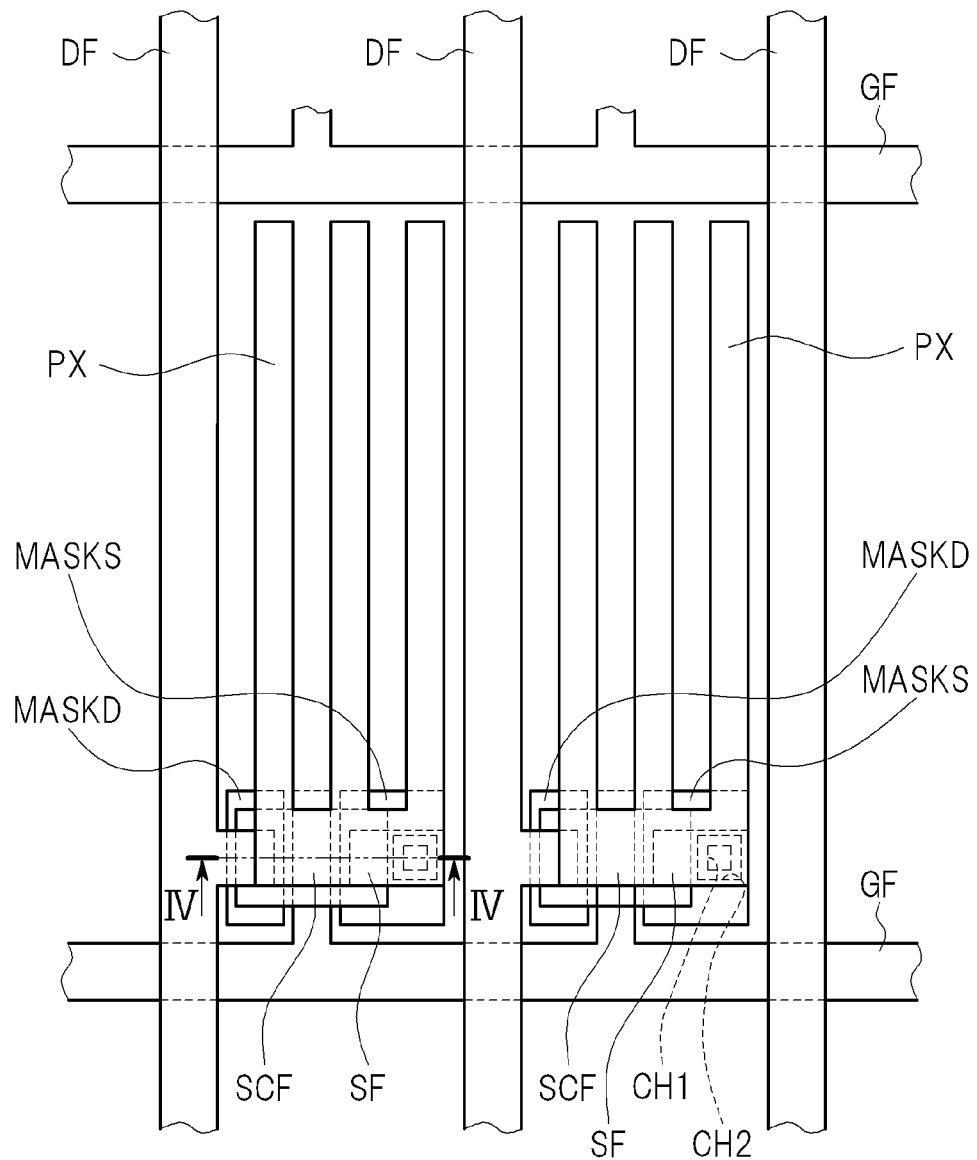
FIG. 3 is an enlarged plan view of two pixel areas in a TFT substrate of a liquid crystal display device according to an embodiment of the invention.

FIG. 3 is an enlarged plan view illustrating two pixel areas of the TFT substrate SUB. As illustrated in FIG. 3, a semiconductor film SCF is formed above an area of a gate electrode film GF that becomes a gate electrode of a thin film transistor TFT through a gate insulating film GI (not illustrated). Further, a drain electrode film DF and a source electrode film SF are formed to be electrically connected to the semiconductor film SCF through an impurity semiconductor film IDS (not illustrated).

Shielding films MASKD and MASKS are formed on both sides of the area of the gate electrode film GF that becomes the gate electrode of the thin film transistor TFT. As seen from the stacking direction, the shielding film MASKD is opposed to an area of the drain electrode film DF that becomes a drain electrode through the gate insulating film GI, the semiconductor film SCF, and the impurity semiconductor film IDS. In the same manner, as seen from the stacking direction, the shielding film MASKS is opposed to an area of the source electrode film SF that becomes a source electrode. In this case, the shielding film MASKS is electrically connected to the source electrode film SF through a contact hole CH2.

Further, a pixel electrode PX is formed above the drain electrode film DF and the source electrode film SF, and the pixel electrode PX is electrically connected to the source electrode film SF through a contact hole CH1.

Figure 4:
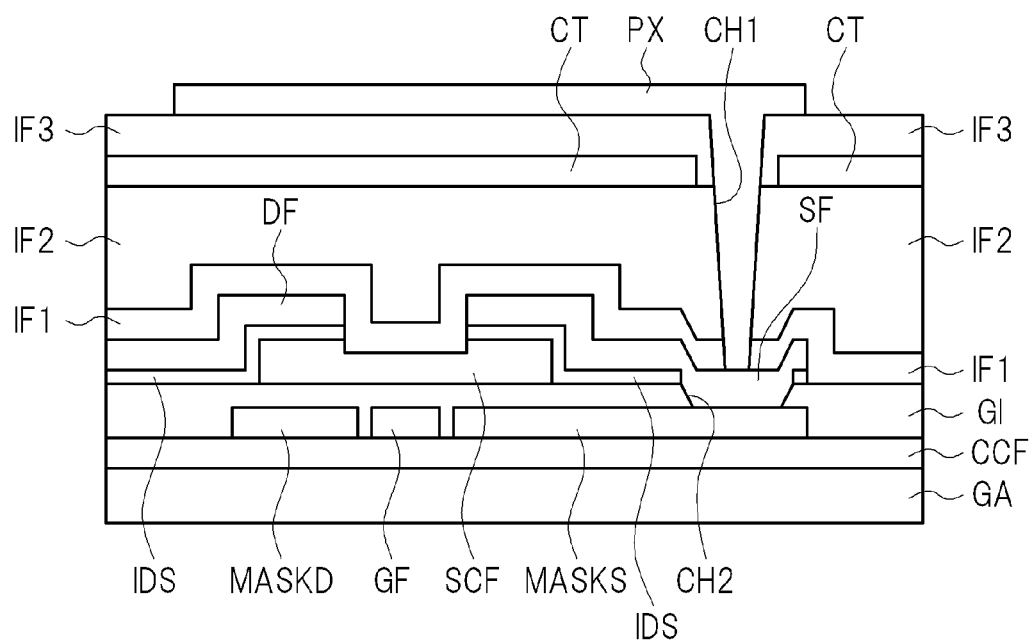
FIG. 4 is a cross-sectional view of a thin film transistor installed on a TFT substrate of a liquid crystal display device according to an embodiment of the invention.

FIG. 4 is a cross-sectional view of the thin film transistor TFT installed on the TFT substrate SUB. FIG. 4 is a schematic view illustrating the cross section taken along line IV-IV illustrated in FIG. 3. The cross section is a cross section that is perpendicular to a direction in which the area of the drain electrode film DF that becomes the drain signal line DL is extended.

As illustrated in FIG. 4, in the TFT substrate SUB, a pollution prevention film CCF is formed on a transparent substrate GA, and the gate electrode film GF having a predetermined shape and the shielding films MASKD and MASKS having predetermined shapes are formed on the pollution prevention film CCF. Here, the transparent substrate GA, for example, is a glass substrate. Further, the gate electrode film GF and the shielding films MASKD and MASKS are formed in the same layer, and is a metal film of MoW. The shielding films MASKD and MASKS are electrically blocked from the gate electrode film GF. That is, they are electrically insulated.

The semiconductor film SCF is formed above the gate electrode film GF and the shielding films MASKD and MASKS through the gate insulting film GI. The semiconductor film SCF is made of microcrystalline silicon. The grain size of the semiconductor film SCF is typically in the range of about 10 nm to 100 nm.

Here, the semiconductor film SCF is formed of a single microcrystalline silicon layer, but is not limited thereto. For example, the semiconductor film SCF may be formed of two layers of microcrystalline silicon and amorphous silicon, or may be formed of a single layer of amorphous silicon. Further, the semiconductor film SCF may be formed of another semiconductor material.

The drain electrode film DF and the source electrode film SF are formed above both ends of the semiconductor film SCF through the impurity semiconductor film IDS. The impurity semiconductor film IDS is made of amorphous silicon doped with impurities such as phosphorus (P). The impurity semiconductor film IDS functions as an ohmic contact with respect to the drain electrode film DF and the source electrode film SF. Further, the drain electrode film DF and the source electrode film SF are formed of a metal such as aluminum (Al). The drain electrode film DF and the source electrode film SF are electrically disconnected. The ohmic contact means that the characteristics of voltage and current indicate linearity in electrical contact portions between a ruling layer and a semiconductor layer, and the like.

The shielding films MASKD and MASKS are opposed to the drain electrode film DF and the source electrode film SF through the gate insulating film GI, the semiconductor film SCF, and the impurity semiconductor film IDS, respectively. That is, as seen from the stacking direction (upward/downward direction in the drawing), the shielding films MASKD and MASKS overlap the drain electrode film DF and the source electrode film SF, respectively. The drain electrode film DF and the source electrode film SF are in contact with the semiconductor film SCF through the impurity semiconductor film IDS. As seen from the stacking direction, contact surface areas, which are in contact with the semiconductor film SCF, of the surfaces that the drain electrode film DF and the source electrode film SF have overlap the shielding films MASKD and MASKS. Here, the contact surface areas indicate portions, which are in electrical contact with the semiconductor film SCF through the impurity semiconductor film IDS, of the surfaces that the drain electrode film DF and the source electrode film SF have.

Further, as illustrated in FIG. 4, the contact hole CH2 is installed on the impurity semiconductor film IDS and the gate insulating film GI, and the source electrode film SF is formed even on the inner side of the contact hole CH2. Because of this, the shielding film MASKS is in electrical contact with the source electrode film SF. By contrast, no contact hole is installed on the side of the drain electrode film DF, and the shielding film MASKD is electrically isolated from drain electrode film DF.

An insulating film IF1 is formed on upper sides of the drain electrode film DF and the source electrode film SF, and further, an insulating film IF2 is formed on an upper side of the insulating film IF1 for smoothing. A common electrode CT having a predetermined shape is formed on an upper side of the insulating film IF2. In this case, the common electrode CT is not illustrated in FIG. 3. An insulating film IF3 is formed on an upper side of the common electrode CT. As illustrated in FIG. 4, a contact hole CH1 is installed on the insulating films IF1, IF2, and IF3. The pixel electrode PX is formed on an upper side of the insulating film IF3 with a predetermined shape and even on the inner side of the contact hole CH1.

The pixel electrode PX is in electrical contact with the source electrode film SF through the contact hole CH1. Further, since the contact hole CH1 is installed in the area where the common electrode CT is not formed, the pixel electrode PX is electrically isolated from the common electrode CT.

Figure 5:
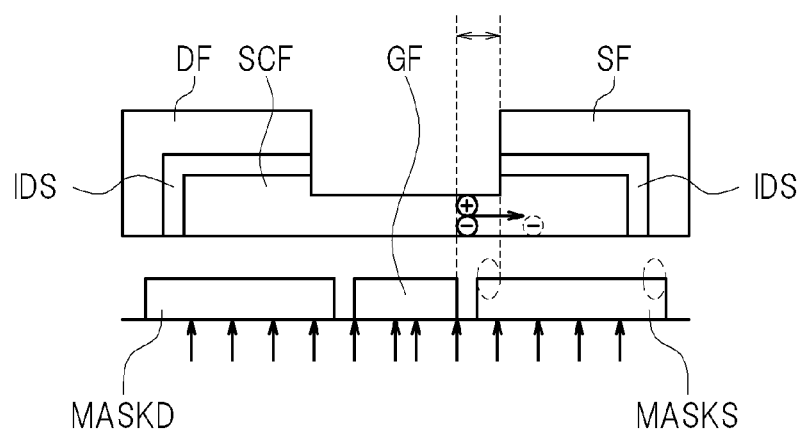
FIG. 5 is a conceptual view illustrating the structure of a thin film transistor according to a first embodiment of the invention.

FIG. 5 is a conceptual view illustrating the structure of the thin film transistor according to this embodiment of the invention, and schematically illustrates a part of the cross section of the thin film transistor TFT illustrated in FIG. 4. As described above, the shielding films MASKD and MASKS are arranged on both sides of the gate electrode film GF. That is, the gate electrode film GF and the shielding films MASKD and MASKS are formed in the same layer. The semiconductor film SCF is arranged above the gate electrode film GF, and the source electrode film SF and the drain electrode film DF are arranged above both ends of the semiconductor film SCF through the impurity semiconductor film IDS. Light from a light source is irradiated from the lower side to the upper side in the drawing. The light from the light source is indicated by arrows in the drawing.

Figure 9A:
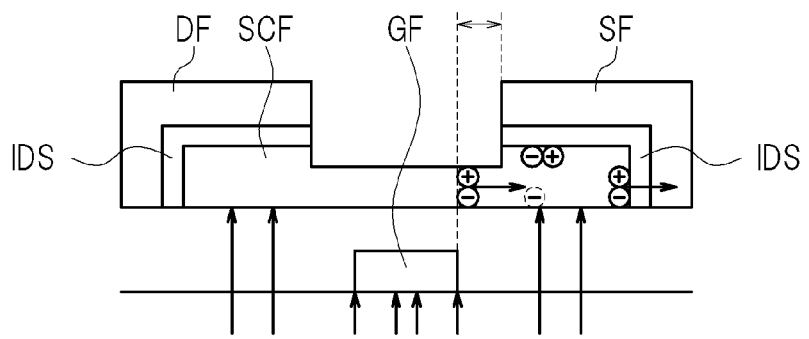
FIG. 9A is a conceptual view illustrating the structure of a thin film transistor in the related art.
Figure 9B:
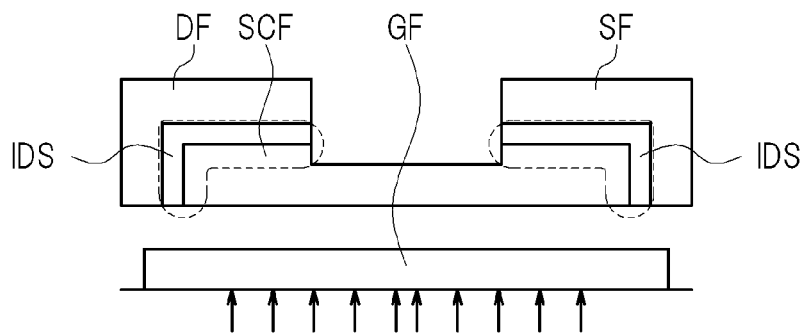
FIG. 9B is a conceptual view illustrating the structure of a thin film transistor in the related art.
Figure 9C:
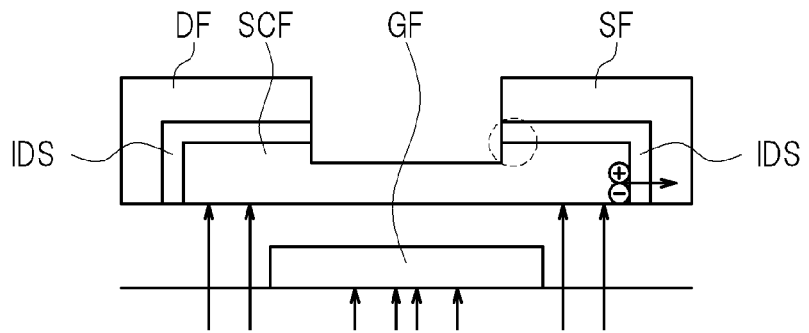
FIG. 9C is a conceptual view illustrating the structure of a thin film transistor in the related art.

In the thin film transistor illustrated in FIG. 5, as seen from the stacking direction (upward/downward direction in the drawing), the gate electrode film GF does not have an area that overlaps the source electrode film SF or the drain electrode film DF, and the gate electrode film GF is offset from the source electrode film SF and the drain electrode film DF. That is, as seen from the stacking direction, the source electrode film SF and the drain electrode film DF are arranged to be spaced apart from the gate electrode film GF, respectively. As a result, even if a voltage is applied between the gate electrode film GF and the source electrode film SF (drain electrode film DF), a strong electric field does not occur near the boundary of the source electrode film SF (drain electrode film DF) and the semiconductor film SCF, for example, as compared with the thin film transistor illustrated in FIG. 9B or 9C. Because of this, the increase of leakage current due to the strong electric field is suppressed.

The structure of the thin film transistor TFT according to this embodiment of the present invention has been described. As illustrated in FIG. 3, according to an aspect of the invention, the shielding film MASKS (first shielding film) overlaps a part of the semiconductor film SCF as seen from the light irradiation direction, and further, overlaps at least a part of the source electrode film SF as seen from the stacking direction (light irradiation direction). Further, the shielding film MASKS is electrically isolated from the gate electrode film GF.

Accordingly, the shielding film MASKS functions as a shielding mask with respect to a part of the semiconductor film SCF. If a voltage is applied to the gate electrode film GF and the source electrode film SF in a state where the gate electrode film GF is electrically connected to the shielding film MASKS or the gate electrode film GF is extended to an area where the shielding film MASKS is arranged, strong electric field occurs near the boundary of the source electrode film SF and the semiconductor film SCF. However, since the shielding film MASKS is arranged, as shown in FIG. 5 with a region of a first gap between the shielding film MASKS and the gate electrode film which does not overlap the source electrode film SF as seen from the light irradiation direction, the occurring electric field is suppressed even if a voltage is applied to the gate electrode film GF and the source electrode film SF as explained further below with reference to FIG. 5. Accordingly, it is possible to suppress both the occurrence of hole-electron pairs and the occurrence of the strong electric field in the thin film transistor, while it is difficult in the related art.

In this case, the shielding film MASKS and the gate electrode film GF are formed in the same layer, and as described later, it becomes possible to form the gate electrode film GF and the shielding film MASKS in the same process to save the production cost.

As illustrated in FIG. 3, as seen from the stacking direction (light irradiation direction), it is preferable that the source electrode film SF does not have an area that overlaps the gate electrode GF. That is, as seen from the stacking direction (light irradiation direction), it is preferable that the source electrode film SF be arranged to be spaced apart from the gate electrode film GF. Accordingly, the occurrence of the strong electric field is more suppressed.

Further, as illustrated in FIG. 3, in the horizontal direction in the drawing, which is a direction in which the semiconductor film SCF is extended, it is preferable that the end of the gate electrode film GF side of the shielding film MASKS be positioned closer to the gate electrode film GF than the end of the gate electrode film GF side of the source electrode film SF, that is, as shown in FIG. 5, a second gap between the source electrode film and the gate electrode film as seen from the light irradiation direction is larger than the first gap between the shielding film MASKS and the gate electrode film. In the area, which is in contact with the source electrode film SF through the impurity semiconductor film IDS, of the semiconductor film SCF, more particularly, in the area near the side of the gate electrode film GF, a large number of hole-electron pairs occurs and the leakage current is increased, if the light irradiation is performed and a voltage is applied between the source electrode film SF and the drain electrode film DF. However, by the shielding film MASKS, this area of the semiconductor film SCF is shielded, and thus the leakage current is greatly suppressed.

Further, as illustrated in FIG. 3, it is preferable that the surface of the source electrode film SF, which is in contact with the semiconductor film SCF through the impurity semiconductor film IDS, that is, the contact surface area that is in electrical contact with the semiconductor film SCF through the impurity semiconductor film IDS be included in the area that overlaps the shielding film MASKS as seen from the stacking direction (light irradiation direction). Accordingly, the hole-electron pairs, which occur in the area of the semiconductor film SCF that is in contact with the source electrode film SF through the impurity semiconductor film IDS can be suppressed, and thus the leakage current can be suppressed.

Further, as illustrated in FIG. 4, it is preferable that the source electrode film SF and the shielding film MASKS be electrically connected to each other. If the shielding film MASKS is electrically isolated from the source electrode film SF, the voltage of the shielding film MASKS is floated, and capacitance is formed between the source electrode film SF and the shielding film MASKS (between the semiconductor film SCF and the shielding film MASKS). Due to the formed capacitance, the voltage of the capacitance between the pixel electrode PX and the common electrode CT is deteriorated to lower the picture quality. However, since the source electrode film SF and the shielding film MASKS are electrically connected, the lowering of the picture quality that may occur is suppressed.

Here, although it is exemplified that the shielding film MASKS is arranged to be opposed to the source electrode film SF, it is preferable that the shielding film MASKD (second shielding film) be arranged to be opposed to the drain electrode film DF (second electrode). If a voltage is applied to the gate electrode film GF and the drain electrode film DF, in the same manner, the leakage current occurs due to the hole-electron pairs occurring in the semiconductor film SCF and the strong electric field occurring near the boundary of the drain electrode film DF and the semiconductor film SCF. However, by suppressing both the occurrence of the hole-electron pairs and the occurrence of the strong electric field, the leakage current can be suppressed.

In this case, in the same manner as the source electrode film SF, as seen from the stacking direction (light irradiation direction), it is preferable that the drain electrode film DF does not have the area that overlaps the gate electrode film GF. Further, in the horizontal direction in the drawing, it is preferable that the end of the gate electrode film GF side of the shielding film MASKD be positioned closer to the gate electrode film GF than the end of the gate electrode film GF side of the drain electrode film DF. Further, it is preferable that the contact surface area of the drain electrode film DF be included in the area, which overlaps the shielding film MASKD, of the drain electrode film DF as seen from the stacking direction (light irradiation direction).

Further, in FIGS. 3 and 4, the source electrode film SF and the shielding film MASKS are electrically connected to each other, whereas the drain electrode film DF and the shielding film MASKD are electrically isolated from each other. That is, the voltage of the shielding film MASKD is floated. This is because the thin film transistor TFT illustrated in FIGS. 3 and 4 is a switching element for supplying a display voltage according to the display data to the pixel electrode PX, and during the image display, a high voltage is not applied between the drain electrode film DF and the gate electrode film GF while the display voltage is applied between the source electrode film SF and the gate electrode film GF. However, even in the case where a high voltage is applied between the drain electrode film DF and the gate electrode film GF, as needed, the drain electrode film DF and the shielding film MASKD may be electrically connected to each other.

In this case, the shielding film MASKS and the gate electrode film GF are electrically isolated from each other, and as illustrated in FIGS. 3 to 5, the above referenced first gap exists between the shielding film MASKS and the gate electrode film GF. Through this gap, light from the light source may be irradiated onto the semiconductor film SCF to generate the hole-electron pairs. Although the leakage current occurs as holes or electrons of the hole-electron pairs reach the source electrode film SF, a considerable distance exists between the area where the hole-electron pairs occurs and the source electrode film SF as the region of the first gap does not overlap the source electrode film SF as seen from the light irradiation direction as noted above, and thus during the movement of the holes (electrons), they collide with the electrons (or holes) that exist in the conductor film SCF to be vanished, so that they do not greatly contribute to the increase of the leakage current. FIG. 5 schematically illustrates the state of vanishing of the electrons, of occurring hole-electron pairs, during movement. This may be the same with respect to the shielding film MASKD.

Hereinafter, a method for manufacturing a thin film transistor TFT according to this embodiment of the invention will be described with reference to FIGS. 6A to 6I.

First, the pollution prevention film CCF is formed on the transparent substrate GA that is a glass substrate (see FIG. 6A), and further, using a sputtering method, a metal film of MoW is formed. Here, although it is exemplified that the metal film is made of MoW, it may be selected from metals such as Al, Al—Si, Al—Cu, Al—Nd, Mo, W, MoW, Ta, and the like, in consideration of temperature in the following processes.

Figure 6A:
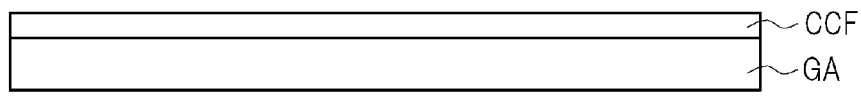
FIG. 6A is a view illustrating a process of fabricating a thin film transistor according to an embodiment of the invention.
Figure 6B:
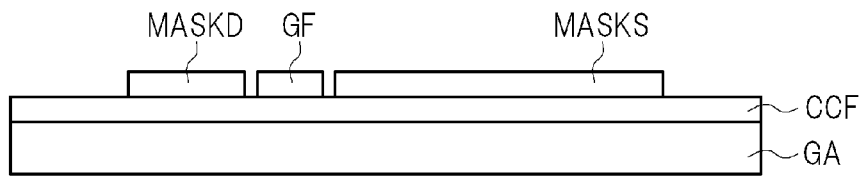
FIG. 6B is a view illustrating a process of fabricating a thin film transistor according to an embodiment of the invention that is continued from FIG. 6A.

Thereafter, using a selective etching method by the photolithography technology, for example, the gate electrode film GF and the shielding films MASKD and MASKS having the shape illustrated in FIG. 3 are formed (see FIG. 6B). That is, the gate electrode films GF and the shielding films MASKD and MASKS are formed in the same layer.

Figure 6C:
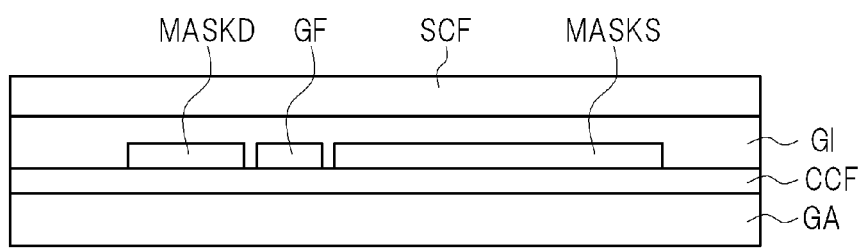
FIG. 6C is a view illustrating a process of fabricating a thin film transistor according to an embodiment of the invention that is continued from FIG. 6B.

Next, the gate insulating film GI is formed to cover the gate electrode film GF and the shielding films MASKD and MASKS, and further, the semiconductor film SCF is formed (see FIG. 6C). The gate insulating film GI and the semiconductor film SCF are successively formed in a CVD method. The gate insulating film GI, for example, is made of silicon dioxide ($SiO_2$). Here, the semiconductor film SCF is made of microcrystalline silicon. By successively forming gate insulating film GI and the semiconductor film SCF using the same apparatus and in the same CVD method, the invasion of foreign substances through interfaces of the respective films or pollution thereof can be greatly reduced.

Here, it is exemplified that the semiconductor film SCF made of microcrystalline silicon is formed in the CVD method, but the invention is not limited thereto. The semiconductor film SCF made of amorphous silicon is formed in the CVD method. Further, after the dehydrogenation treatment of the semiconductor film SCF, fine crystallization of the amorphous silicon may be performed by ELA (Excimer Laser Annealing) or RTA (Rapid Thermal Annealing).

Photoresist (not illustrated) is formed on the whole upper layer of the substrate, and by the photolithography technology, only the photoresist that is positioned on the upper layer of the area that corresponds to the area of the semiconductor film SCF where the semiconductor layer of the thin film transistor TFT is formed is remained, and the photoresist that is positioned on the upper layer of other areas of the semiconductor film SCF is removed.

Using the remaining photoresist as a mask, other areas except for the area where the semiconductor layer of the thin film transistor TFT of the semiconductor film SCF are removed by etching. Thereafter, for example, by asking by oxygen plasma or a remover, the remaining photoresist is removed (see FIG. 6D).

A plasma hydrogen process is performed with respect to the semiconductor film SCF. Further, the impurity semiconductor film IDS is formed on the whole area of the upper layer of the substrate (see FIG. 6E). The impurity semiconductor film IDS, for example, is successively formed by the CVD method. The impurity semiconductor film IDS may be made of amorphous silicon doped with impurities such as phosphorous P.

Figure 6D:
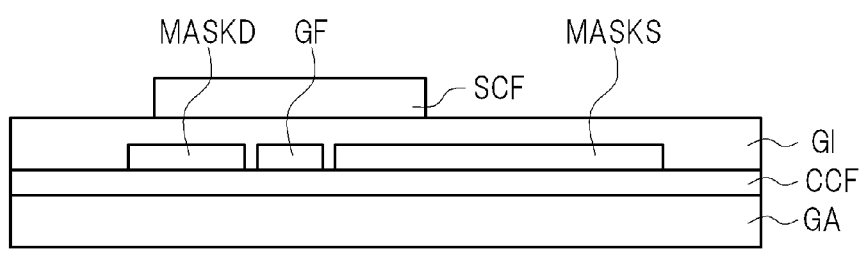
FIG. 6D is a view illustrating a process of fabricating a thin film transistor according to an embodiment of the invention that is continued from FIG. 6C.
Figure 6E:
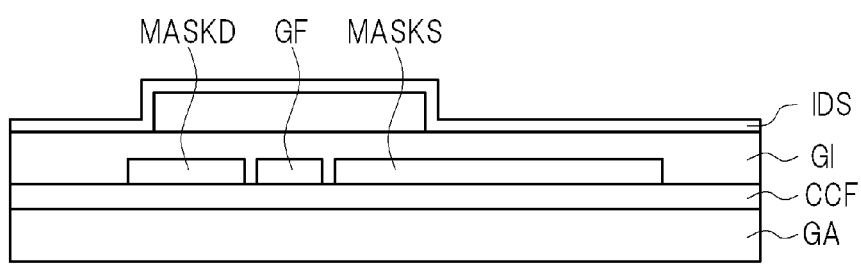
FIG. 6E is a view illustrating a process of fabricating a thin film transistor according to an embodiment of the invention that is continued from FIG. 6D.
Figure 6F:
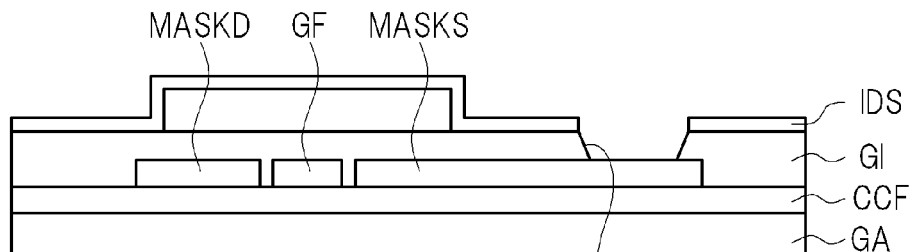
FIG. 6F is a view illustrating a process of fabricating a thin film transistor according to an embodiment of the invention that is continued from FIG. 6E.

In the same manner as the process illustrated in FIG. 6D, using the photoresist, the respective areas of the impurity semiconductor film IDS and the gate insulating film GI are removed by etching to form the contact hole CH2.

Figure 6G:
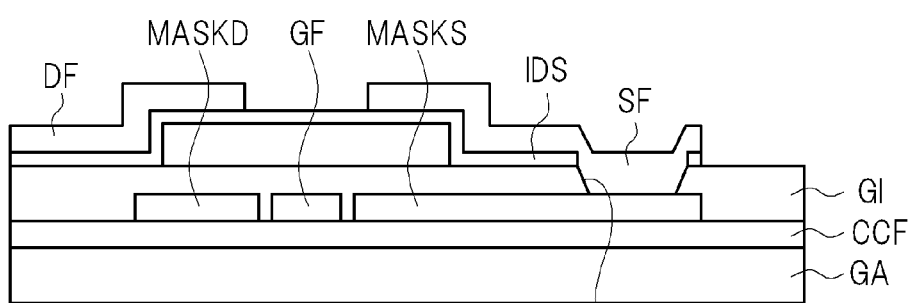
FIG. 6G is a view illustrating a process of fabricating a thin film transistor according to an embodiment of the invention that is continued from FIG. 6F.

A metal film of Al is formed on the whole area of the upper layer of the substrate, and the drain electrode film DF and the source electrode film SF are formed by a selective etching by the photolithography technology (see FIG. 6G). Here, although it is exemplified that the material of the metal film is Al, the material may be selected from metals such as Al, Al—Si, Al—Cu, Al—Nd, Mo, W, MoW, Ta, and the like, in consideration of temperature in the following processes. Further, the source electrode film SF is formed even on the inside of the contact hole CH2.

Figure 6H:
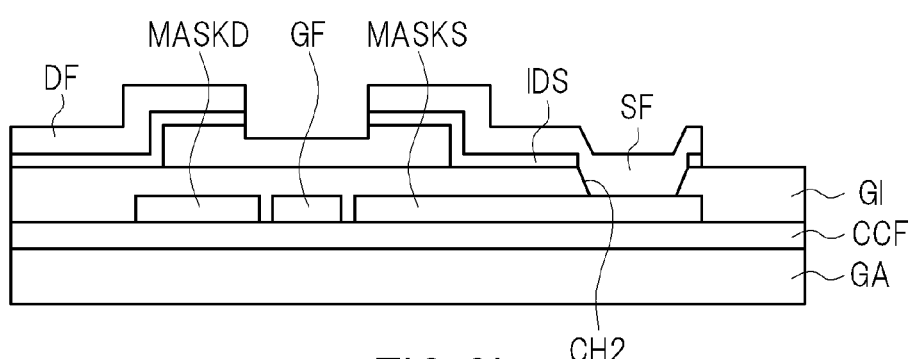
FIG. 6H is a view illustrating a process of fabricating a thin film transistor according to an embodiment of the invention that is continued from FIG. 6G.
Figure 6I:
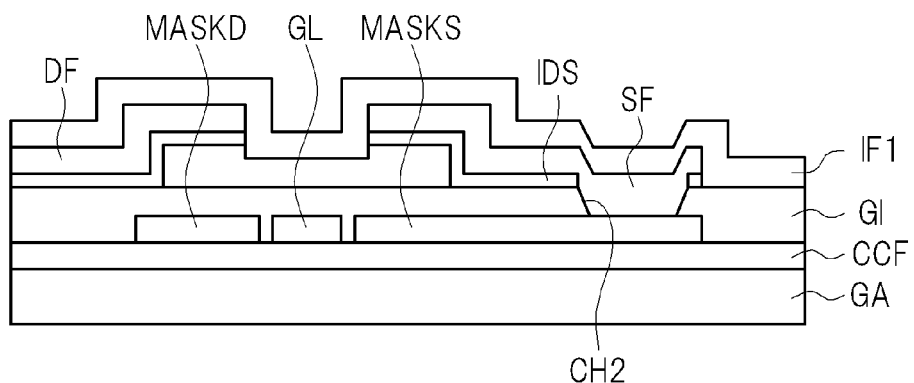
FIG. 6I is a view illustrating a process of fabricating a thin film transistor according to an embodiment of the invention that is continued from FIG. 6H.

Further, by performing overcoat etching of the impurity semiconductor film IDS that is positioned in the area between the drain electrode and the source electrode of the thin film transistor TFT, the semiconductor film SCF that is positioned on the lower layer of the area is sufficiently exposed (see FIG. 6H). Accordingly, the impurity semiconductor film IDS functions as an ohmic contact with respect to the drain electrode and the source electrode, and electrically separates the drain electrode and the source electrode.

Further, the insulating film IF1, for example, is formed on the whole area of the upper layer of the substrate by the CVD method. The insulating film IF1, for example, is made of a silicon nitride (SiN) film (see FIG. 6I). Further, the insulating film IF2 for smoothing is formed on the upper side of the insulating film IF1, and further, the common electrode CT of a predetermined shape and the insulating film IF3 are formed. Then, by removing the predetermined areas of the insulating films IF1, IF2, and IF3 by etching, the contact hole CH1 is formed.

By forming the pixel electrode PX of a predetermined shape, which includes the inside of the contact hole CH1 and positioned on the upper side of the insulating film IF3, the thin film transistor TFT illustrated in FIG. 4 is fabricated.

Second Embodiment

The basic configuration of the display device according to a second embodiment of the invention is the same as that of the display device according to the first embodiment. The difference between the display devices according to the first and second embodiments lies on the structure of the thin film transistor TFT.

Figure 7:
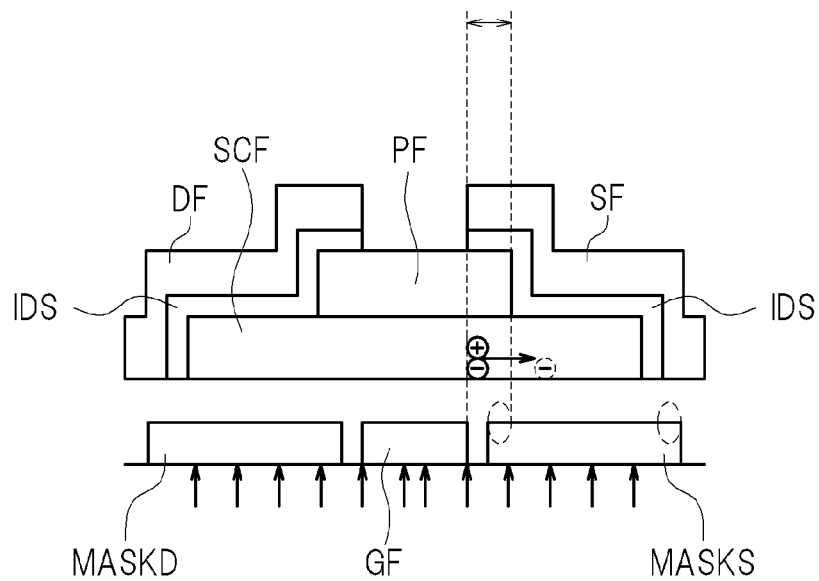
FIG. 7 is a conceptual view illustrating the structure of a thin film transistor according to a second embodiment of the invention.

FIG. 7 is a conceptual view illustrating the structure of a thin film transistor TFT according to the second embodiment of the invention. As illustrated in FIG. 7, according to the thin film transistor TFT according to this embodiment, a protection film PF is formed on the upper side of the semiconductor film SCF. Here, the protection film PF, for example, is an insulating film made of SiN or $SiO_2$. When etching the impurity semiconductor film IDS that is positioned in the area between the drain electrode and the source electrode, the etching stops on the upper surface of the protection film PF. Because of this, the structure of the thin film transistor according to this embodiment is called a channel etch stopper structure.

A thin film transistor TFT in which the source electrode film SF overlaps the gate electrode film GF as seen from the stacking direction is considered. If a voltage is applied between the gate electrode film GF and the source electrode film SF, a strong electric field occurs near the boundary of the source electrode film SF and the semiconductor film SCF. If the protection film PF is arranged on the upper side of the semiconductor film SCF, the strength of the electric field that occurs in the area where the source electrode film SF is in contact with the protection film PF through the impurity semiconductor film IDS is generally lower than the strength of the electric field that occurs in the area where the source electrode film SF is in contact with the semiconductor film SCF through the impurity semiconductor film IDS due to the film thickness of the protection film PF.

In the case of the thin film transistor TFT illustrated in FIG. 7, the source electrode film SF is opposed to the gate electrode film GF, and thus the stronger electric field occurs near the area of the source electrode film SF that is in contact with the semiconductor film SCF through the impurity semiconductor film IDS.

Accordingly, even in the thin film transistor TFT according to this embodiment, as illustrated in FIG. 7, the shielding film MASKS (first shielding film) overlaps a part of the semiconductor film SCF as seen from the light irradiation direction, and further overlaps at least a part of the source electrode film SF as seen from the stacking direction (light irradiation direction). Further, the shielding film MASKS is formed in the same layer as the gate electrode film GF and is electrically isolated from the gate electrode film GF. Accordingly, both the occurrence of the hole-electron pairs and the occurrence of the strong electric field can be suppressed.

As illustrated in FIG. 7, it is preferable that the area of the semiconductor film SCF that is in contact with the source electrode film SF through the impurity semiconductor film IDS be arranged to be spaced apart from the gate electrode film GF as seen from the stacking direction (light irradiation direction). Accordingly, the occurrence of the strong electric field is further suppressed.

Further, it is preferable that the end of the gate electrode film GF side of the shielding film MASKS be positioned closer to the gate electrode film GF than the end of the gate electrode film GF side of the region of the source electrode film SF electrically connected to the semiconductor film SCF with respect to the horizontal direction in the drawing that is the direction where the semiconductor film SCF is extended. Accordingly, if a voltage is applied between the gate electrode film GF and the source electrode film SF, the occurrence of a large number of hole-electron pairs, which occurs near the area of the source electrode film SF that is in electrical contact with the semiconductor film SCF, is suppressed and thus the leakage current can be suppressed.

Further, it is preferable that the contact surface area that is in electrical contact with the semiconductor film SCF through the impurity semiconductor film IDS in the surfaces of the source electrode film SF be included in the area in which the source electrode film SF overlaps the shielding film MASKS as seen from the stacking direction (light irradiation direction). Accordingly, the hole-electron pairs, which occur in the area of the semiconductor film SCF that is in contact with the source electrode film SF through the impurity semiconductor film IDS can be suppressed, and thus the leakage current can be suppressed.

Further, in the same manner as the thin film transistor TFT according to the first embodiment of the invention, it is preferable that the source electrode film SF and the shielding film MASKS be electrically connected to each other. Accordingly, capacitance is formed between the source electrode film SF and the shielding film MASKS (between the semiconductor film SCF and the shielding film MASKS). Due to the formed capacitance, the voltage of the capacitance between the pixel electrode PX and the common electrode CT is deteriorated to lower the picture quality. However, since the source electrode film SF and the shielding film MASKS are electrically connected to each other, the lowering of the picture quality that may occur is suppressed. Further, this is the same with respect to the shielding film MASKD (second shielding film) that is arranged to be opposed to the drain electrode film DF (second electrode film).

Although the thin film transistor TFT that is installed in the pixel area of the liquid crystal display device has been described as an example with respect to the thin film transistor TFT according to this embodiment has been exemplified, it is not limited to the thin film transistor TFT that is installed in the pixel area. For example, the thin film transistor TFT maybe a thin film transistor that is installed in a frame area. The leakage current is current that occurs while the switch of the switching element is turned off, that is, while an off voltage is applied to the gate electrode, and in the case where the voltage is applied between the gate electrode and the source electrode (drain electrode), the invention can be applied. That is, the first electrode may be a source electrode or a drain electrode.

Figure 8:
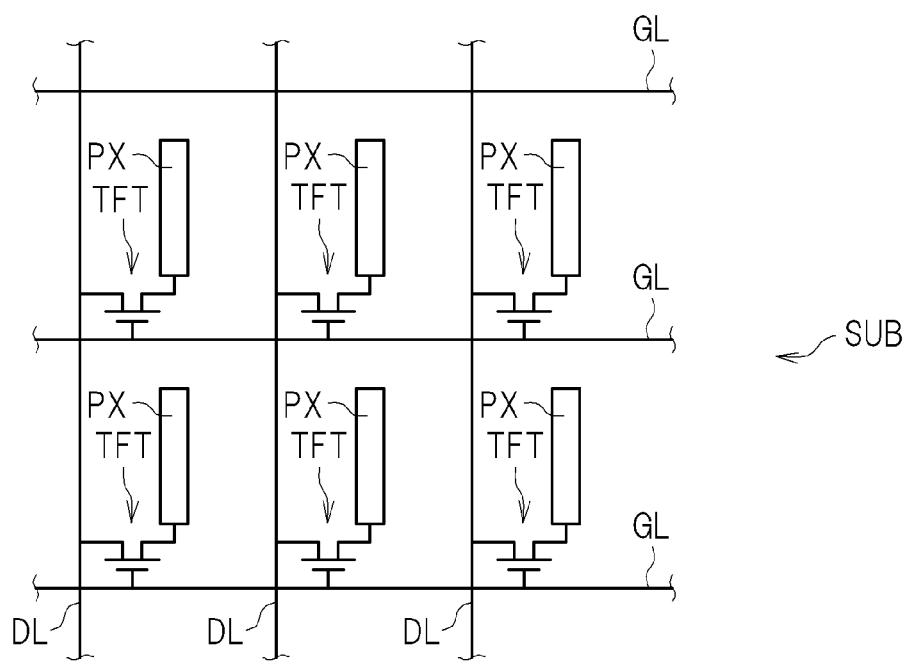
FIG. 8 is a diagram illustrating an equivalent circuit of a main part of a TFT substrate of a liquid crystal display device according to another example of an embodiment of the invention.

In the liquid crystal display according to this embodiment, the liquid crystal driving method has been described as one IPS method. However, according to the invention, the driving method may be another IPS driving method, or for example, may be another driving method such as a VA (Vertically Aligned) method or a TN (Twisted Nematic) method. FIG. 8 illustrates an equivalent circuit of a main part of the TFT substrate SUB of the liquid crystal display device as another example according to the embodiments of the invention, and FIG. 8 illustrates an equivalent circuit of the TFT substrate SUB constituting the VA type or TN type liquid crystal display device. In the case of the VA type or the TN type, instead of installing the common electrode CT and the common signal lines CL on the TFT substrate SUB, the common electrode CT (not illustrated) is installed on the filter substrate CF, on which color filters are installed, to be opposed to the TFT substrate SUB.

Although the liquid crystal display device has been described according to the embodiments of the invention, the invention is not limited thereto, and may be applied to another display device, for example, such as organic EL (Electro Luminescence) element or the like. Further, the thin film transistor according to the embodiments of the invention is not limited to a case where it is provided in the display device, and may be applied to other devices.

While there have been described what are at present considered to be certain embodiments of the invention, it will be understood that various modifications may be made thereto, and it is intended that the appended claims cover all such modifications as fall within the true spirit and scope of the invention.

What is claimed is:
1. A thin film transistor comprising:
   a gate electrode film onto which light from a light source is irradiated;
   a semiconductor film formed on an opposite side of the gate electrode film to the light source side, through an insulating film;
   first and second electrode films formed to be in electrical contact with the semiconductor film; and
   a first shielding film formed in a same layer as the gate electrode film and electrically isolated from the gate electrode film,
   wherein the first shielding film overlaps a part of the semiconductor film as seen from a light irradiation direction and also overlaps at least a part of the first electrode film as seen from the light irradiation direction, and
   wherein a region of a first gap between the first shielding film and the gate electrode film does not overlap the first electrode film as seen from the light irradiation direction.

2. The thin film transistor according to claim 1, wherein the first electrode film is arranged to be spaced apart from the gate electrode film as seen from the light irradiation direction.

3. The thin film transistor according to claim 1, wherein at least a part of the first electrode film includes a contact surface area that is in electrical contact with the semiconductor film.

4. The thin film transistor according to claim 1, wherein the first electrode film and the first shielding film are in electrical contact with each other.

5. The thin film transistor according to claim 1, further comprising:
   a second shielding film formed in the same layer as the gate electrode film and electrically isolated from the gate electrode film,
   wherein the second shielding film overlaps a part of the semiconductor film as seen from the light irradiation direction and also overlaps at least a part of the second electrode film as seen from the light irradiation direction.

6. A display device having a thin film transistor described in claim 1.

7. The thin film transistor according to claim 2, wherein a second gap between the first electrode film and the gate electrode film as seen from the light irradiation direction is larger than the first gap between the first shielding film and the gate electrode film.

8. The thin film transistor according to claim 4, wherein the first electrode film is directly connected to the first shielding film.

9. The thin film transistor according to claim 5,
   wherein a pixel electrode is electrically connected to the first electrode film, and a common electrode is opposed to the pixel electrode, and
   wherein the first shielding film overlaps a part of the common electrode, and the second shielding film overlaps the common electrode.

10. The thin film transistor according to claim 1, wherein the semiconductor film is formed of amorphous silicon.

11. The thin film transistor according to claim 1, wherein the semiconductor film is formed of microcrystalline silicon.

12. A liquid crystal display device comprising a liquid crystal panel, a backlight, and a thin film transistor formed on the liquid crystal panel, the thin film transistor comprising:
- a gate electrode film onto which light from the back light is irradiated;
- a semiconductor film formed on an opposite side of the gate electrode film to the light source side, through an insulating film;
- first and second electrode films formed to be in electrical contact with the semiconductor film; and
- a first shielding film formed in a same layer as the gate electrode film and electrically isolated from the gate electrode film,
- wherein the first shielding film overlaps a part of the semiconductor film as seen from a light irradiation direction and also overlaps at least a part of the first electrode film as seen from the light irradiation direction, and
- wherein a region of a first gap between the first shielding film and the gate electrode film does not overlap the first electrode film as seen from the light irradiation direction.

13. The liquid crystal display device according to claim 12, wherein the first electrode film is arranged to be spaced apart from the gate electrode film as seen from the light irradiation direction.

14. The liquid crystal display device according to claim 12, wherein at least a part of the first electrode film includes a contact surface area that is in electrical contact with the semiconductor film.

15. The liquid crystal display device according to claim 12, wherein the first electrode film and the first shielding film are in electrical contact with each other.

16. The liquid crystal display device according to claim 12, further comprising:
- a second shielding film formed in the same layer as the gate electrode film and electrically isolated from the gate electrode film,
- wherein the second shielding film overlaps a part of the semiconductor film as seen from the light irradiation direction and also overlaps at least a part of the second electrode film as seen from the light irradiation direction.

* * * * *